United States Patent
Klemens et al.

(10) Patent No.: US 7,916,373 B2
(45) Date of Patent: Mar. 29, 2011

(54) TAPERED REINFORCING STRUTS FOR MICROMACHINED STRUCTURES

(75) Inventors: Fred P. Klemens, Hillsborough, NJ (US); Flavio Pardo, New Providence, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 628 days.

(21) Appl. No.: 11/836,540

(22) Filed: Aug. 9, 2007

(65) Prior Publication Data

US 2009/0040636 A1 Feb. 12, 2009

(51) Int. Cl.
*G02B 26/08* (2006.01)
*G02B 26/10* (2006.01)
*G02B 26/12* (2006.01)

(52) U.S. Cl. .................. 359/199.4; 359/221.2

(58) Field of Classification Search ............ 359/212.1, 359/212.2, 213.1, 223.1, 290, 295, 198.1, 359/199.4, 221.2
See application file for complete search history.

(56) References Cited

U.S. PATENT DOCUMENTS

| 5,781,675 | A | 7/1998 | Tseng et al. | 385/30 |
| 5,969,465 | A | 10/1999 | Neukermans et al. | 310/333 |
| 2003/0108319 | A1 | 6/2003 | Chong et al. | 385/129 |
| 2006/0260515 | A1 * | 11/2006 | Hodges et al. | 108/6 |

FOREIGN PATENT DOCUMENTS

| EP | 1 275 997 A2 | 1/2003 |
| JP | 2001 033727 A | 2/2001 |
| WO | WO 99/00990 | 1/1999 |

* cited by examiner

*Primary Examiner* — Alessandro Amari
(74) *Attorney, Agent, or Firm* — Mendelsohn, Drucker & Associates, P.C.; Yuri Gruzdkov; Steve Mendelsohn (57) ABSTRACT

According to one embodiment, a reinforcing strut of the invention is a polyhedron attached to a plate and having at least two slanted facets, with each of the slanted facets oriented with respect to the plane of the plate at an angle different from about 90 degrees. Two slanted facets intersect to form an edge that causes the strut to have a tapered profile along the longitudinal axis of the strut.

20 Claims, 7 Drawing Sheets

TAPERED REINFORCING STRUTS FOR MICROMACHINED STRUCTURES

BACKGROUND OF THE INVENTION

1. Field of the Invention

The present invention relates to micro-electromechanical systems (MEMS) and, more specifically, to reinforcing struts for MEMS structures.

2. Description of the Related Art

MEMS mirror arrays find applications in optical switches, adaptive optics, displays, etc. One advantageous characteristic of a MEMS mirror array is that each mirror can have many degrees of freedom in a relatively small footprint and be of high optical quality. The high optical quality is achieved, e.g., by making each mirror relatively smooth, flat, and highly reflective. Surface smoothness is usually achieved by chemical-mechanical polishing. High reflectivity is achieved using optically reflecting coatings, e.g., made of aluminum or gold. However, the overall mirror flatness is relatively difficult to achieve due to stress-gradients in the mirror material itself and stress mismatches between the mirror material and the material of the optically reflecting coating.

One known way to reduce stress-induced mirror deformations is to have one or more reinforcing beams (struts) attached to the backside of the mirror. A typical prior-art reinforcing strut has a uniform rectangular cross-section and runs from one edge of the mirror to the opposite edge. However, one problem with such struts is that they can significantly (i) increase the moment of inertia of the mirror, thereby disadvantageously increasing the mirror's response time to control signals, and (ii) limit the range of motion for the mirror by increasing its effective thickness.

SUMMARY OF THE INVENTION

Problems in the prior art are addressed by providing a MEMS device, in which a movable mirror is reinforced by a tapered strut. According to one embodiment, the tapered strut is a polyhedron having at least two slanted facets, with each of the slanted facets oriented with respect to the plane of the mirror at an angle different from about 90 degrees. Two of the slanted facets intersect to form an edge that causes the strut to have a tapered profile along the longitudinal axis of the strut. Advantageously, the tapered profile of the strut enables: (i) the movable mirror to have a relatively small moment of inertia and a correspondingly fast response time to control signals and (ii) the strut not to significantly limit the range of motion for the mirror.

According to one embodiment, a device of the invention comprises (A) a structure having a first substantially flat surface and (B) a first beam attached to the first surface. The first beam comprises first and second facets, with at least one of the first and second facets oriented with respect to the first surface at an angle different from about 90 degrees. The first and second facets intersect to form a first edge. The first beam has a thickness that changes along the first edge, said thickness being a dimension perpendicular to the first surface.

According to another embodiment, a fabrication method of the invention comprises the step of forming a first trench in a first layer of a multilayered wafer. The first layer has a first substantially flat surface. The first trench has first and second sidewalls, with at least one of the first and second sidewalls oriented with respect to the first surface at an angle different from about 90 degrees. The first and second sidewalls intersect to form a first edge. The first trench has a depth that changes along the first edge, said depth being a dimension perpendicular to the first surface.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Figure 1A:
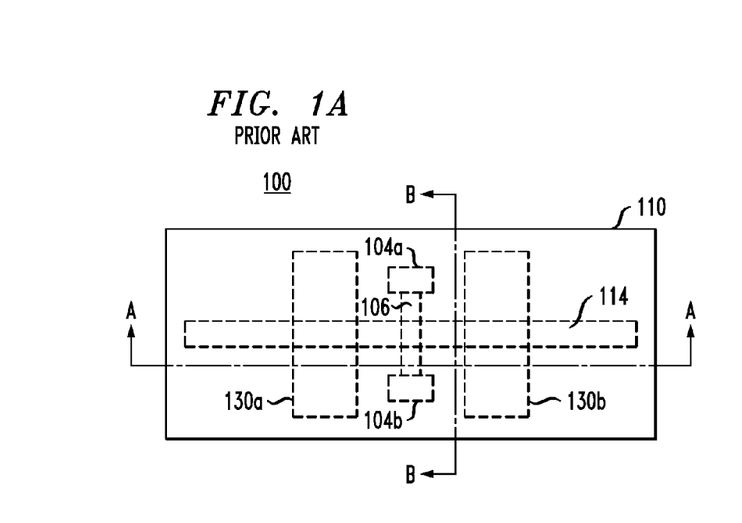
FIGS. 1A-D show a prior-art MEMS device having a movable mirror.
Figure 1B:
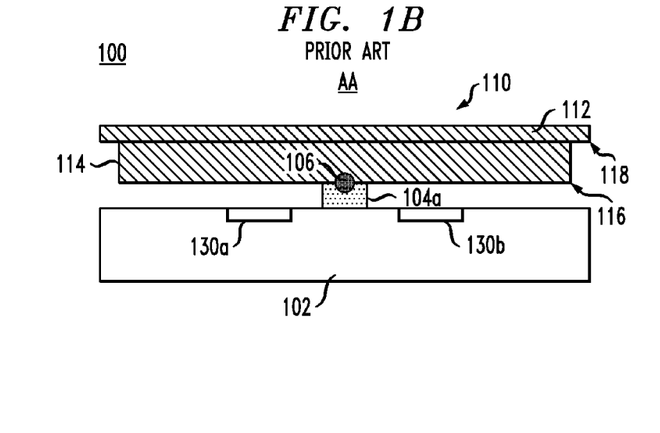
Figure 1C:
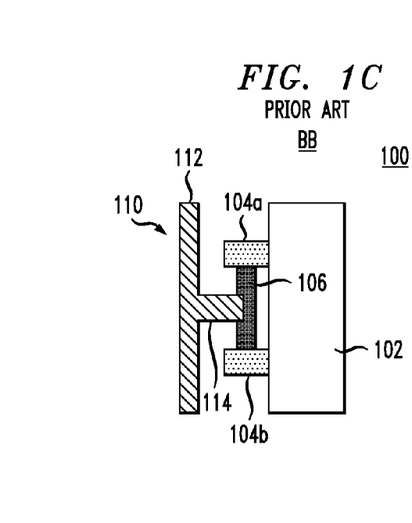
Figure 1D:
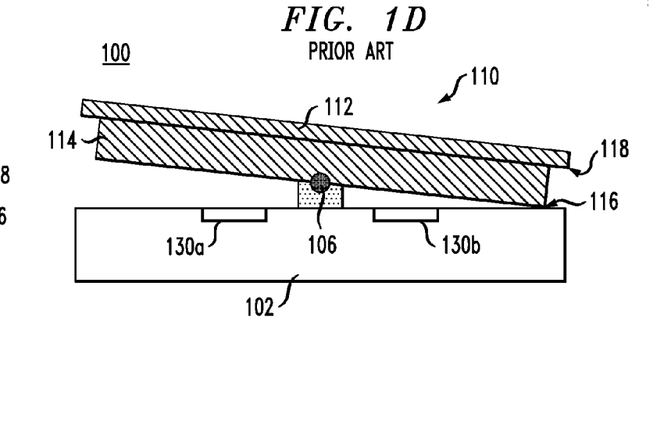

FIGS. 1A-D show a prior-art MEMS device 100 having a movable mirror 110. More specifically, FIG. 1A shows a top view of device 100, and FIGS. 1B-C show cross-sectional side views of the device along the planes labeled AA and BB, respectively, in FIG. 1A. FIG. 1D shows a cross-sectional side view of device 100 similar to that shown in FIG. 1B, but with mirror 110 tilted.

Mirror 110 has (i) a rectangular plate 112 that can have an optically reflective coating (not explicitly shown in FIG. 1) and (ii) a reinforcing strut 114 that stiffens plate 112 along its longitudinal axis (i.e., a coordinate axis running along the long dimension of the strut), which helps to reduce possible stress induced deformations of the plate. Strut 114 is a beam having a uniform rectangular cross-section (see FIG. 1C). A torsion spring 106 supported on a substrate 102 by a pair of anchors 104a-b is attached to a middle portion of strut 114 to enable rotation of mirror 110 with respect to the substrate. If a voltage differential is applied between mirror 110 and one of electrodes 130a-b, then the resulting electrostatic force causes the mirror to tilt, e.g., as shown in FIG. 1D. If the voltage differential is removed, then the spring force of torsion spring 106 returns mirror 110 into the initial position shown in FIG. 1B.

One problem with mirror 110 is that, due to the fact that strut 114 has a significant mass located at a relatively large distance from the rotation axis defined by torsion spring 106, the moment of inertia of the mirror is relatively large. As a result, mirror 110 responds relatively slowly to voltage changes, and a transition between the two mirror orientations shown in FIGS. 1B and 1D can take a relatively long time. In addition, strut 114 disadvantageously limits the maximum deflection angle for mirror 110 because an edge 116 of the strut comes into contact with substrate 102 sooner than an edge 118 of plate 112 would come into contact with the substrate in the absence of the strut.

Figure 2A:
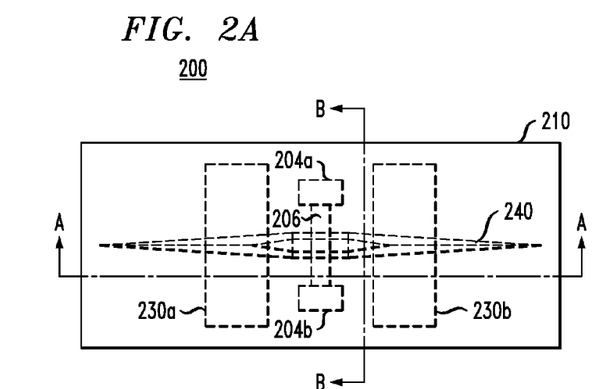
FIGS. 2A-D show a MEMS device having a movable mirror according to one embodiment of the invention.
Figure 2B:
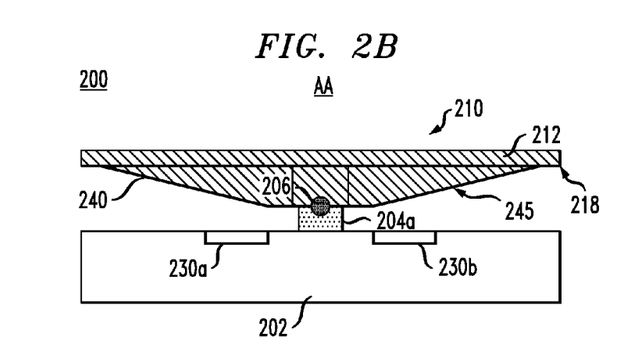
Figure 2C:
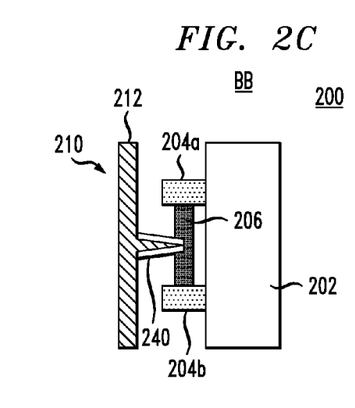
Figure 2D:
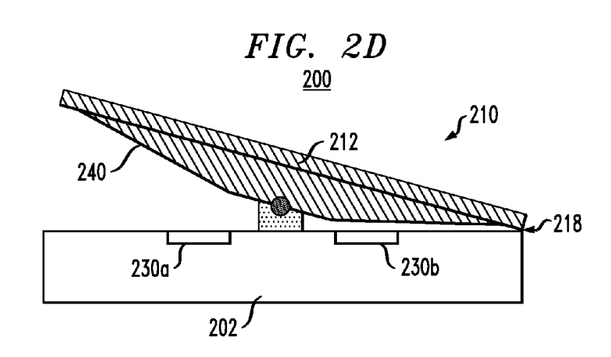

FIGS. 2A-D show a MEMS device 200 having a movable mirror 210 according to one embodiment of the invention. More specifically, FIG. 2A shows a top view of device 200, and FIGS. 2B-C show cross-sectional side views of the device along the planes labeled AA and BB, respectively, in FIG. 2A. FIG. 2D shows a cross-sectional side view of device 200 similar to that shown in FIG. 2B, but with mirror 210 tilted.

Device 200 is generally analogous to device 100 of FIG. 1, and analogous elements of the two devices are designated with labels having the same last two digits. However, one difference between devices 100 and 200 is that, in the latter device, movable mirror 210 has a tapered reinforcing strut 240 instead of the rectangular strut 114 of the former device. The geometry of strut 240 and its differences with the geometry of strut 114 are described in more detail below.

Briefly referring back to FIG. 1, strut 114 is a rectangular beam having six facets. Two of the facets (i.e., the upper and lower facets in the projection of FIG. 1B) are generally parallel to the plane of plate 112. The remaining four facets (i.e., two relatively long sidewalls and two relatively small termini) of strut 114 are generally orthogonal to the plane of plate 112. The sidewalls are also parallel to one another (see FIG. 1C). This combination of geometric characteristics produces a rectangular cross-section for strut 114 that is generally uniform along the length (long dimension) of the strut.

Figure 2E:
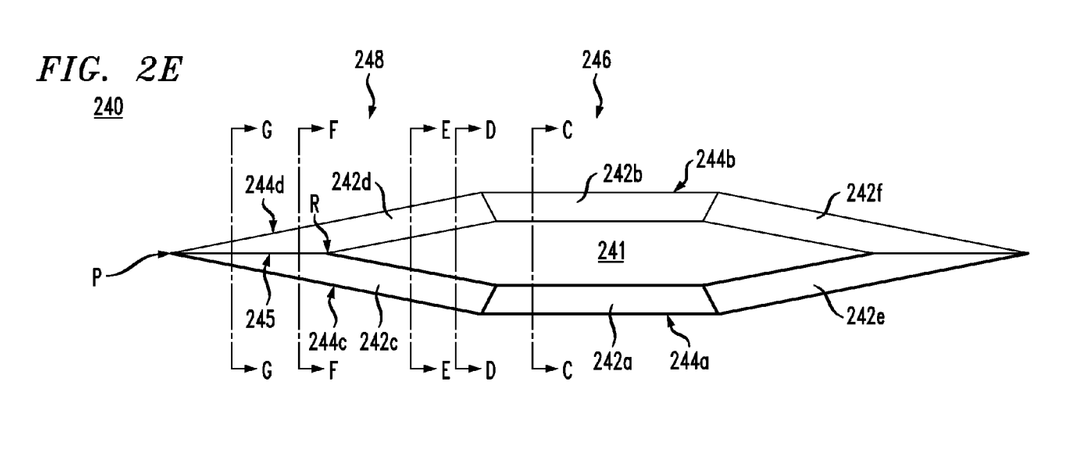
FIGS. 2E-J show enlarged views of a tapered reinforcing strut of the MEMS device shown in FIGS. 2A-D.
Figure 2F:
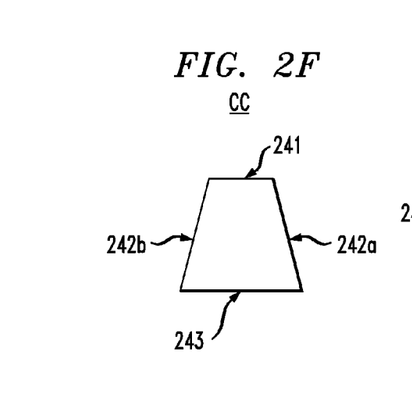
Figure 2G:
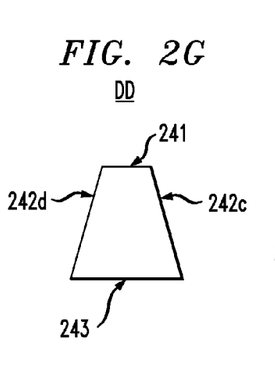
Figure 2H:
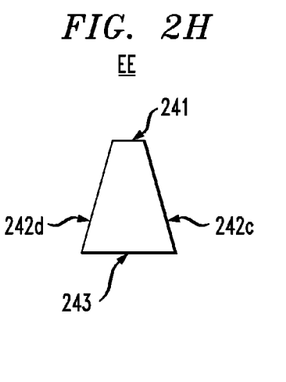
Figure 2I:
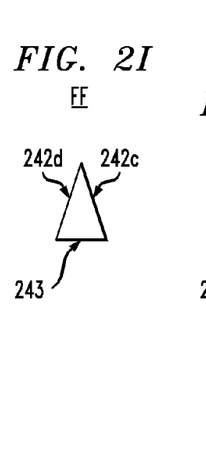
Figure 2J:
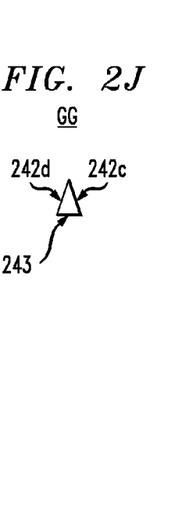

FIGS. 2E-J show, not to scale, enlarged views of tapered reinforcing strut 240. More specifically, FIG. 2E shows strut 240 as it would be seen if mirror 210 was taken out of device 200 and laid flat, plate 212 down, on the sheet of paper having FIG. 2E. FIGS. 2F-J show cross-sections of strut 240 by the planes labeled CC, DD, EE, FF, and GG, respectively, in FIG. 2E.

Unlike strut 114 of device 100, strut 240 of device 200 is a polyhedron (i.e., a geometric object with flat faces (facets) and straight edges) having eight facets (which makes strut 240 an octahedron). Strut 240 has facets 241 and 243 that are substantially parallel to the plane of plate 212. Each of the remaining six facets 242a-f is a slanted sidewall that is not orthogonal to the plane of plate 212. In one embodiment, the angle between the plane of facet 242 and the plane of plate 212 is the same for all facets 242a-f.

Facets 242a-b are oriented with respect to one another so that an edge 244a of facet 242a is substantially parallel to an edge 244b of facet 242b. As a result, a cross-section of strut 240 through its middle portion 246 having facets 242a-b has a shape of a trapezoid shown in FIG. 2F. Note that cross-sections of middle portion 246 taken at different locations along the length of the strut have substantially the same trapezoid shape.

Facets 242c-d are oriented with respect to one another so that an edge 244c of facet 242c is not parallel to an edge 244d of facet 242d. In one embodiment, the angle between edges 244c-d is about 1 degree. Edges 244c-d intersect at point P, and facets 242c-d intersect to form an edge 245, which has point P as its one end and point R as its other end. In geometric terms, point P is a vertex formed by facets 242c-d and 243, and point R is a vertex formed by facets 242c-d and 241.

FIGS. 2G-J show various cross-sections of strut 240 through its left portion 248 having facets 242c-d. As these figures demonstrate, the cross-sections of portion 248 at different locations along the longitudinal axis of strut 240 have different shapes. More specifically, the cross-sections of portion 248 located to the right (in FIG. 2E) of point R have a trapezoid shape. The trapezoid area generally decreases as the distance between the location of the cross-section and point R gets shorter (see FIGS. 2G-H). The cross-sections of portion 248 located to the left of point R have a triangular shape. The size of the triangle generally decreases as the distance between the location of the cross-section and point R gets larger (see FIGS. 2I-J).

One effect of the decreasing cross-section areas of strut 240, as one proceeds from portion 246 toward point P, is that the strut has a relatively small mass located at relatively large distances from the rotation axis defined by torsion spring 206 (see FIGS. 2A-B). As a result, the moment of inertia of mirror 210 is significantly smaller than that of a comparably sized mirror 110. Due to the smaller moment of inertia, mirror 210 is able to respond to voltage changes applied to electrodes 230a-b significantly faster than mirror 110 is able to respond to voltage changes applied to electrodes 130a-b, and a transition between the two mirror orientations shown in FIGS. 2B and 2D can advantageously take a relatively short time. Note that a faster response time for mirror 210 is achieved without sacrificing the mirror's flatness because the reinforcing effect of strut 240 on plate 212 is very similar to the reinforcing effect of strut 114 on plate 112.

Another effect of the decreasing cross-section areas of strut 240 is that edge 245 creates a vertical taper for strut 240 along the long dimension of the strut (see FIG. 2B). As a result, unlike strut 114 of mirror 110, strut 240 of mirror 210 does not limit the maximum deflection angle for the mirror. More specifically, mirror 210 can be rotated with respect to substrate 202 so that edge 218 of plate 212 comes into direct physical contact with the substrate (see FIG. 2D). Thus, mirror 210 in device 200 advantageously has a wider rotation range than mirror 110 in device 100.

Figure 3A:
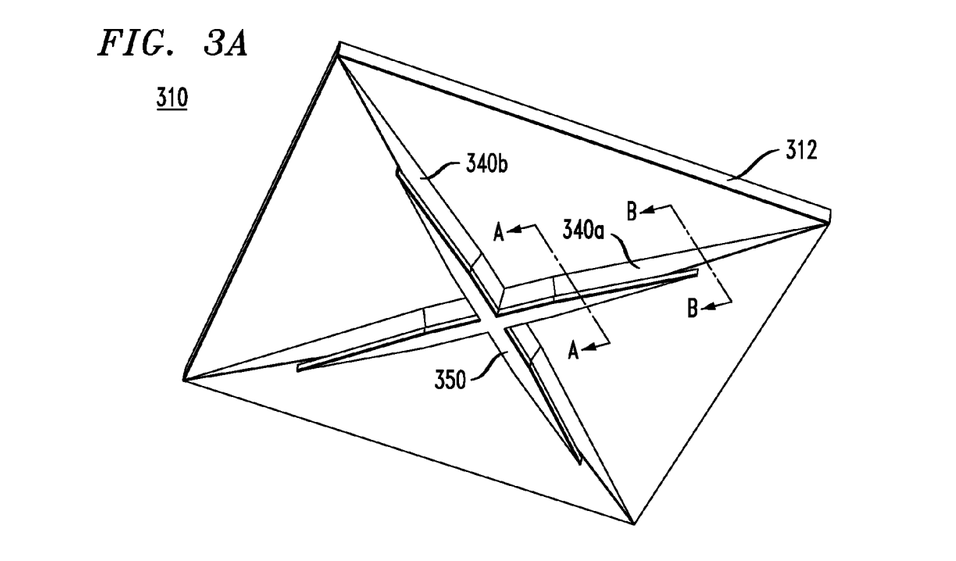
FIGS. 3A-C show a mirror that can be used in the MEMS device shown in FIG. 2 according to one embodiment of the invention.
Figure 3B:
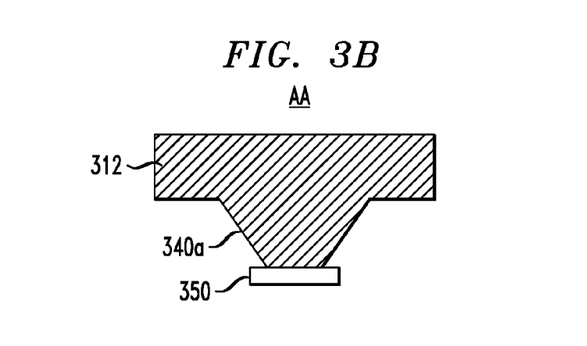
Figure 3C:
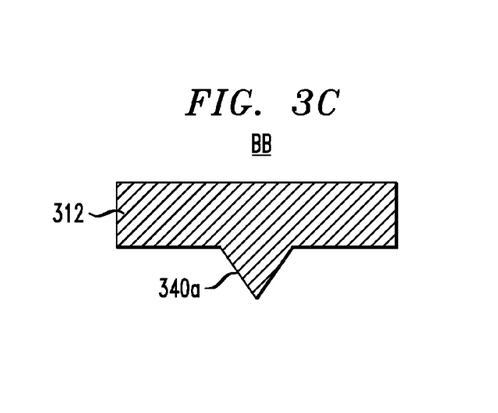

FIGS. 3A-C show a mirror 310 that can be used as mirror 210 according to one embodiment of the invention. More specifically, FIG. 3A shows a perspective three-dimensional view of mirror 310 from the bottom of the mirror. FIGS. 3B-C show, not to scale, cross-sections of mirror 310 by planes AA and BB, respectively, shown in FIG. 3A.

Mirror 310 has a plate 312 that is reinforced by two tapered struts 340a-b, each of which is generally analogous to strut 240 (FIG. 2). Each of struts 340a-b is located along a respective diagonal of plate 312. Due to their orientation, struts 340a-b intersect to form an X-shaped reinforcing structure for plate 312. This X-shaped structure is attached to a corresponding X-shaped base 350. In one embodiment, base 350 can be used to connect mirror 310 to a torsion spring similar to spring 206 of FIG. 2.

Figure 4A:
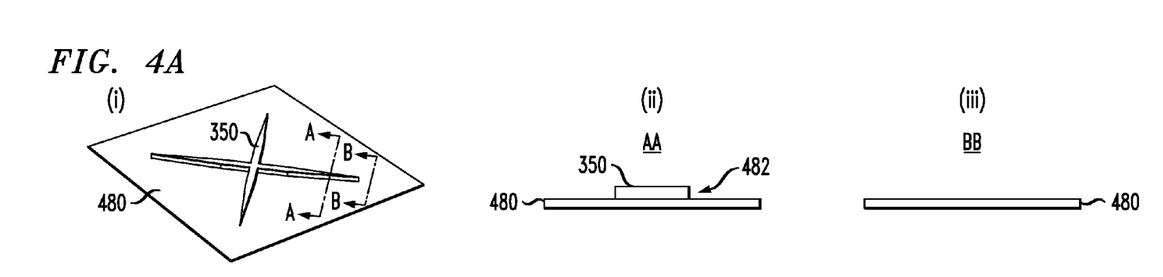
FIGS. 4A-C illustrate representative fabrication steps for the mirror shown in FIG. 3 according to one embodiment of the invention.
Figure 4B:
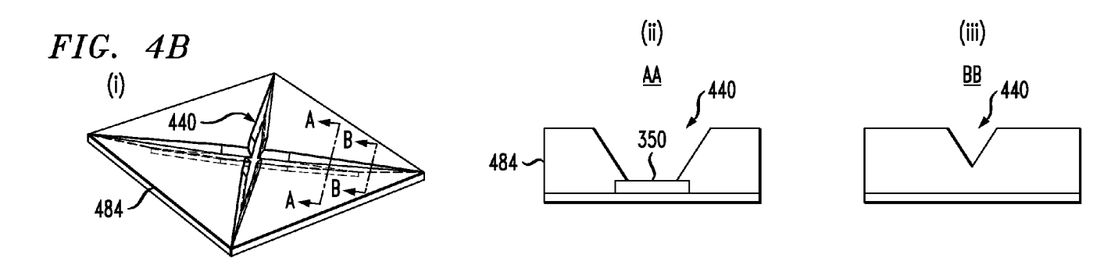
Figure 4C:
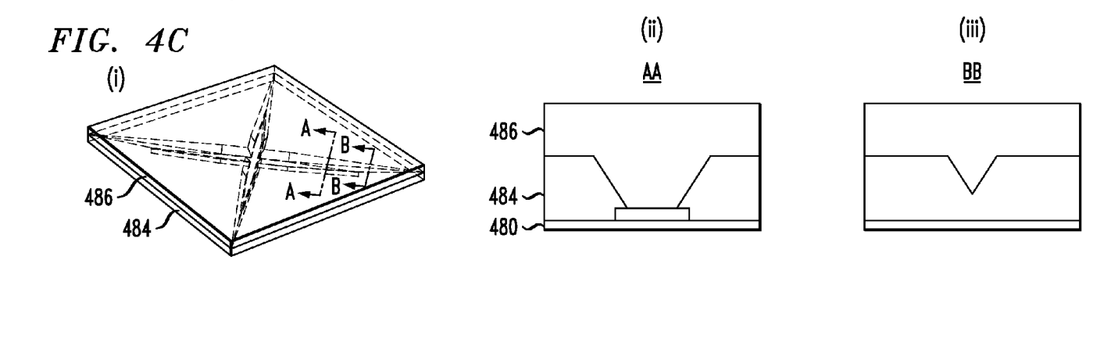

FIGS. 4A-C illustrate representative fabrication steps for mirror 310 (FIG. 3) according to one embodiment of the invention, using a typical micromachining process with silicon as a structural material and silicon oxide as a sacrificial material. More specifically, each of FIGS. 4A-C shows three views labeled (i), (ii), and (iii), respectively. Each view (i) is a perspective three dimensional top view of a wafer, using which mirror 310 is being fabricated, at the corresponding fabrication step. Each of views (ii) is a cross-sectional side view of the wafer along the plane labeled AA in view (i). Each of views (iii) is a cross-sectional side view of the wafer along the plane labeled BB in view (i). The final structure of mirror 310 manufactured using the fabrication process of FIGS. 4A-C is shown in FIGS. 3A-C, to which the description of FIGS. 4A-C provided below also refers.

Referring to FIGS. 4A(i)-(iii), fabrication of mirror 310 begins with a silicon oxide layer 480. Layer 480 can be formed during the last step of the preceding fabrication processing steps, e.g., those used for the formation of torsion springs similar to spring 206 and electrodes similar to electrodes 230. The structures formed during the preceding steps are not explicitly shown in FIG. 4. First, a silicon layer 482 is deposited over substrate 480. Then layer 482 is patterned and etched to form base 350.

Referring to FIGS. 4B(i)-(iii), first, a silicon-oxide layer 484 is deposited over the structure of FIG. 4A. Chemical-mechanical polishing can be used if needed to create a smooth outer surface not having the topography corresponding to patterned silicon layer 482. Layer 484 is then covered with a photoresist mask having an opening in the shape of the top facet (analogous to facet 243 of strut 240) of the strut structure having struts 340a-b. The resulting structure is subjected to an etch process that etches layer 484 by creating a trench 440 having slanted walls. Various implementations of this etch process are described in more detail below. Base 350 acts as an etch stop. After the etching of layer 484 is completed, the photoresist mask is stripped off.

Referring to FIGS. 4C(i)-(iii), first, a silicon layer 486 is deposited over the structure of FIG. 4B. The material of layer 486 fills trench 440 to form struts 340a-b and, after the trench is filled, forms plate 312. Then, layer is 486 is subjected to chemical-mechanical polishing to create a smooth surface for plate 312. Finally, the sacrificial material of silicon oxide layers 480 and 484 is etched away to release mirror 310 from the structure shown in FIG. 4C.

Reactive ion etch (RIE) processes for etching oxide layers are well known in the semiconductor device-fabrication art and have achieved wide acceptance in the semiconductor industry. Older RIE processes are known to create features having slanted walls. A significant amount of effort and innovation went into the development of newer RIE processes that enable the creation of substantially vertical walls. One skilled in the art will appreciate that, without the special techniques developed for vertical wall etching, a RIE process will typically produce a slanted wall.

Figure 5:
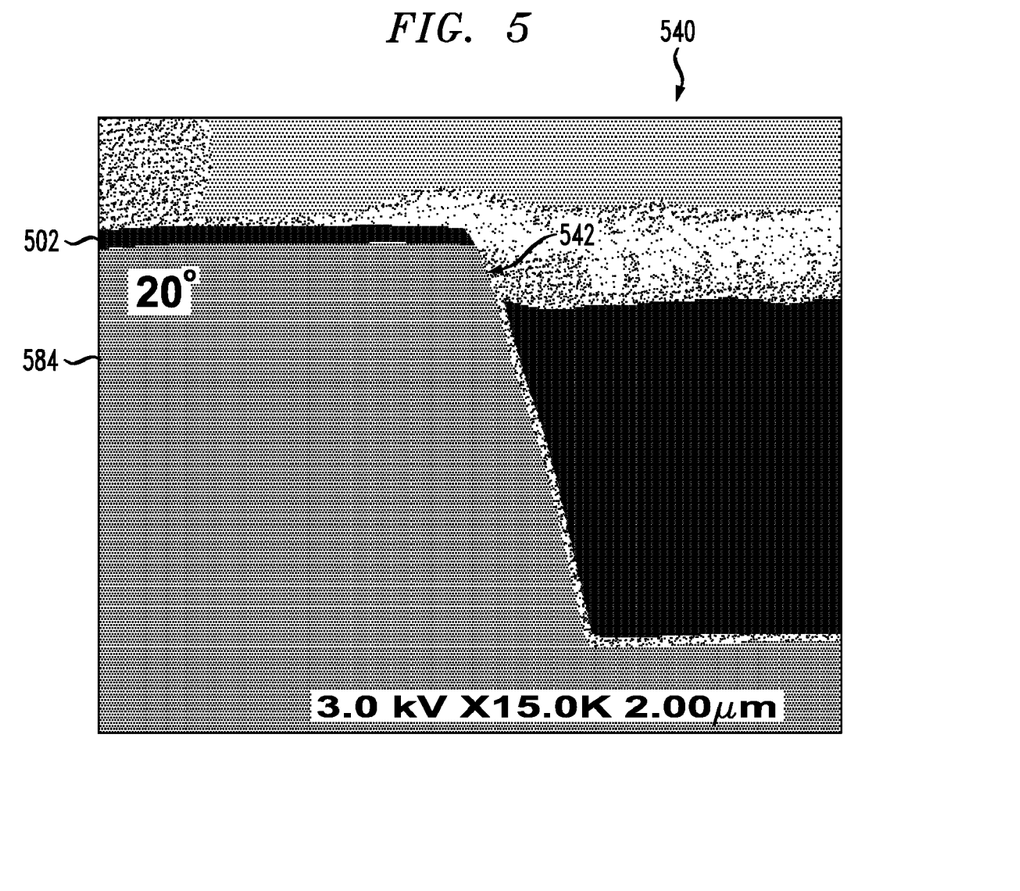
FIG. 5 shows a slanted wall formed using an etch process that can be used in the fabrication method shown in FIG. 4 according to one embodiment of the invention.

FIG. 5 shows a slanted wall 542 formed using a RIE process that can be used in the fabrication method shown in FIG. 4 according to one embodiment of the invention. More specifically, FIG. 5 is a rendering of a microphotograph showing a cross-section of a sacrificial layer 584 that is similar to sacrificial layer 484 of FIG. 4. A trench 540 shown in FIG. 5 has been formed using a so-called "tapering by photoresist" etching technique, which produced wall 542 slanted at an angle of about 20 degrees. A photoresist mask 502 deposited over the top surface of sacrificial layer 584 protects the underlying regions of that layer. The regions unprotected by photoresist mask 502 are exposed to plasma formed under the following conditions: $[CF_4]$=40 sccm; $[CHF_3]$=100 sccm; $[Ar]$=150 sccm; pressure=300 mTorr; substrate temperature=0° C.; RF power=1200 W; magnetic field 60 G. Under these conditions, a carbon passivant is being formed and deposited upon the exposed portions of the sacrificial layer. However, the passivant is continuously removed by the plasma from horizontally oriented surfaces and can build up only on sidewall surfaces. The effect of the passivant is that wall 542 of trench 540 is formed at an angle and becomes a slanted wall. The slant of wall 542 can be varied by varying RIE parameters, such as gas composition, pressure and temperature, magnetic field, and RF power.

Figure 6A:
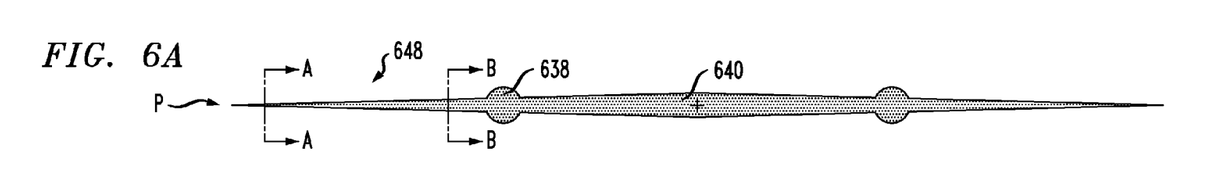
FIGS. 6A-D illustrate a trench having slanted walls formed using an etch process that can be used in the fabrication method shown in FIG. 4 according to another embodiment of the invention.
Figure 6B:
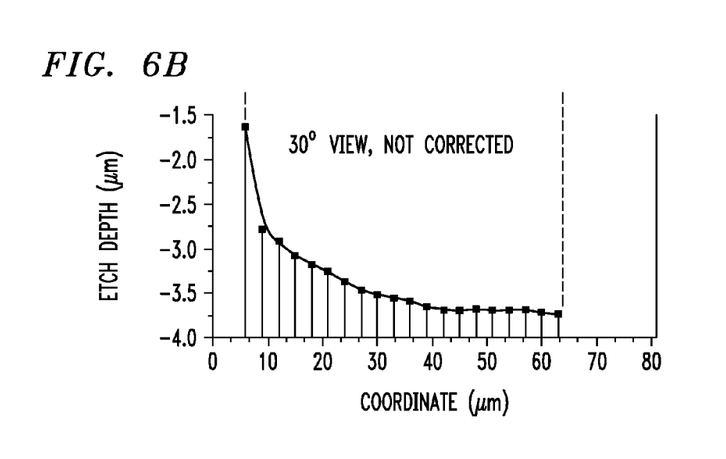
Figure 6C:
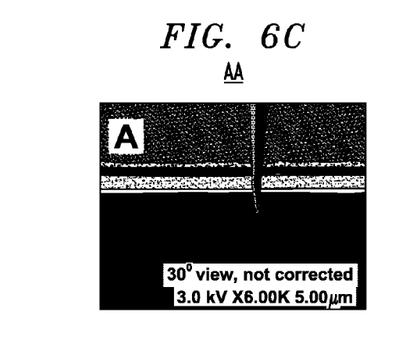
Figure 6D:
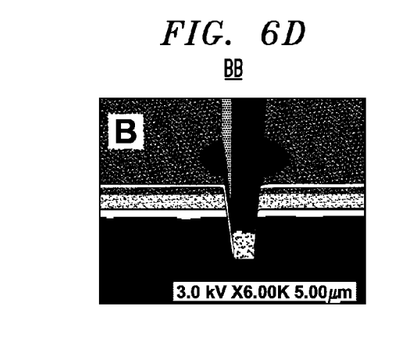

FIGS. 6A-D illustrate a trench 640 having slanted walls formed using a RIE process that can be used in the fabrication method shown in FIG. 4 according to another embodiment of the invention. More specifically, FIG. 6A shows a top view of trench 640; FIG. 6B graphically illustrates the depth profile of the trench; and FIGS. 6C-D are renderings of the microphotographs showing respective cross-sections of the wafer in which trench 640 has been formed along planes labeled AA and BB, respectively, in FIG. 6A.

Trench 640 is formed using a so-called RIE etch lag. The term "etch lag" refers to a known effect in RIE processes, due to which, under the same etch conditions, portions of the etched layer exposed to plasma through smaller openings in the photoresist mask etch slower than those exposed through bigger openings. Since the width of the opening in the photoresist mask corresponding to a portion 648 of trench 640 located between a circular well 638 and point P is continuously decreasing, the RIE etch lag creates a taper profile graphically shown in FIG. 6B. The taper is also evident in FIGS. 6C-D. When trench 640 is filled with silicon, the resulting strut will conform to the shape of trench 640 and be tapered accordingly. Note that the combination of slanted facets and the REI etch lag enables a large degree of taper tuning. For example, a certain degree of strut tapering can be achieved using the REI etch lag alone, e.g., when edges similar to edges 244c-d come together at a relatively small angle of around 1 degree.

While this invention has been described with reference to illustrative embodiments, this description is not intended to be construed in a limiting sense. Although tapered struts of the invention have been described in reference to MEMS mirrors, such struts can similarly be used to reinforce other MEMS structures. Struts can have different, not necessarily polyhedral, shapes, e.g., as illustrated by FIG. 6. A tapered edge can be formed by intersecting (i) a slanted facet and an upright facet or (ii) two slanted facets. Various modifications of the described embodiments, as well as other embodiments of the invention, which are apparent to persons skilled in the art to which the invention pertains are deemed to lie within the principle and scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the invention. The use of terms such as height, length, width, top, bottom, is strictly to facilitate the description of the invention and is not intended to limit the invention to a specific orientation. For example, height does not imply only a vertical rise limitation, but is used to identify one of the three dimensions of a three-dimensional structure as shown in the figures. Such "height" would be vertical where a wafer is horizontal, but would be horizontal where the wafer is vertical, and so on. Similarly, while many figures show the different structural layers as horizontal layers, such orientation is for descriptive purpose only and not to be construed as a limitation.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electromechanical systems) devices, MOEMS (micro-opto-electromechanical systems) devices, micromachines, Microsystems, and devices produced using microsystems technology or microsystems integration.

Although the present invention has been described in the context of implementation as MEMS devices, the present invention can in theory be implemented at any scale, including scales larger than micro-scale.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

What is claimed is:

1. A device, comprising:
   a structure having a first substantially flat surface; and
   a first beam attached to the first surface, wherein:
      the first beam comprises first and second facets, with each of the first and second facets oriented with respect to the first surface at an angle different from about 90 degrees;
      the first and second facets intersect to form a first edge;
      the first beam has a thickness that changes along the first edge, said thickness being a dimension perpendicular to the first surface; and
      the device is a micro-electromechanical system (MEMS) device.

2. The device of claim 1, wherein:
   the structure comprises a plate; and
   the first beam is a strut adapted to reinforce the plate against deformation.

3. The device of claim 1, wherein the first beam has a substantially octahedron shape.

4. The device of claim 1, wherein a first cross-section of the first beam has a triangular shape.

5. The device of claim 4, wherein a second cross-section of the first beam has a trapezoid shape.

6. The device of claim 1, further comprising:
   a second beam attached to the first surface, wherein the first and second beams intersect to form an X-shaped beam structure.

7. The device of claim 6, wherein:
   the second beam comprises third and fourth facets, with at least one of the third and fourth facets oriented with respect to the first surface at an angle different from about 90 degrees;
   the third and fourth facets intersect to form a second edge; and
   the second beam has a thickness that changes along the second edge, said thickness being a dimension perpendicular to the first surface.

8. The device of claim 6, further comprising an X-shaped base attached to the X-shaped beam structure.

9. The device of claim 1, wherein:
   the structure and the first beam are part of a mirror supported on a substrate; and
   the mirror is adapted to rotate with respect to the substrate about a rotation axis.

10. The device of claim 9, wherein:
    the structure comprises a plate; and
    the changing thickness prevents the beam from coming into direct physical contact with the substrate due to the rotation.

11. The device of claim 9, wherein the changing thickness causes cross-section area of the first beam to decrease as the distance between the cross-section location and the rotation axis increases.

12. A fabrication method, comprising:
    forming a first trench in a first layer of a multilayered wafer, wherein:
       the first layer has a substantially flat surface;
       the first trench has first and second sidewalls, with at least one of the first and second sidewalls oriented with respect to the flat surface at an angle different from about 90 degrees;
       the first and second sidewalls intersect to form a corresponding edge; and
       the first trench has a depth that changes along said corresponding edge, said depth being a dimension perpendicular to the flat surface;
    filling the first trench with material to form a first beam;
    depositing additional material over the first layer and the filled trench to form a structure having a first substantially flat surface adjacent to the flat surface of the first layer, wherein the first beam is attached to the first surface; and
    removing the first layer to release the structure with the first beam, wherein:
       the first beam comprises first and second facets, each corresponding to a respective sidewall of the first trench, with each of the first and second facets oriented with respect to the first surface at an angle different from about 90 degrees;
       the first and second facets intersect to form a first edge; and
       the first beam has a thickness that changes along the first edge, said thickness being a dimension perpendicular to the first surface; and
       the device is a MEMS device.

13. The method of claim 12, wherein the first beam has a substantially octahedron shape.

14. The method of claim 12, wherein a first cross-section of the first beam has a triangular shape.

15. The method of claim 14, wherein a second cross-section of the first beam has a trapezoid shape.

16. The method of claim 12, further comprising:
    forming a second beam attached to the first surface, wherein the first and second beams intersect to form an X-shaped beam structure.

17. The method of claim 16, wherein:
    the second beam comprises third and fourth facets, with at least one of the third and fourth facets oriented with respect to the first surface at an angle different from about 90 degrees;

the third and fourth facets intersect to form a second edge; and the second beam has a thickness that changes along the second edge, said thickness being a dimension perpendicular to the first surface.

18. The method of claim 16, further comprising:

forming an X-shaped base attached to the X-shaped beam structure.

19. The method of claim 12, further comprising forming a minor supported on a substrate, wherein:

the structure and the first beam are part of the minor;

the mirror is adapted to rotate with respect to the substrate about a rotation axis; and the changing thickness of the first beam causes cross-section area of the first beam to decrease as the distance between the cross-section location and the rotation axis increases.

20. A MEMS device, comprising:

a structure having a first substantially flat surface; and a first beam attached to the first surface, wherein:

the first beam comprises first and second facets, with at least one of the first and second facets oriented with respect to the first surface at an angle different from about 90 degrees;

the first and second facets intersect to form a first edge;

the first beam has a thickness that changes along the first edge, said thickness being a dimension perpendicular to the first surface; and the first beam has a substantially octahedron shape.

\* \* \* \* \*

UNITED STATES PATENT AND TRADEMARK OFFICE
CERTIFICATE OF CORRECTION

| | | |
|---|---|---|
| PATENT NO. | : 7,916,373 B2 | Page 1 of 1 |
| APPLICATION NO. | : 11/836540 | |
| DATED | : March 29, 2011 | |
| INVENTOR(S) | : Fred Klemens and Flavio Pardo | |

It is certified that error appears in the above-identified patent and that said Letters Patent is hereby corrected as shown below:

- Column 9, Line 10, please replace the word "minor" with the word -- mirror --.

- Column 9, Line 11, please replace the word "minor" with the word -- mirror --.

Signed and Sealed this
Thirteenth Day of September, 2011

David J. Kappos
*Director of the United States Patent and Trademark Office*